United States Patent
Kaida et al.

[19]

[11] Patent Number: 6,107,727
[45] Date of Patent: Aug. 22, 2000

[54] THICKNESS EXTENSIONAL VIBRATION MODE PIEZOELECTRIC RESONATOR

[75] Inventors: Hiroaki Kaida, Moriyama; Mitsuhiro Yamada, Shiga-ken; Jiro Inoue, Omihachiman, all of Japan

[73] Assignee: Murata Manufacturing Co., Ltd., Japan

[21] Appl. No.: 09/089,820

[22] Filed: Jun. 3, 1998

[30] Foreign Application Priority Data

Jun. 12, 1997 [JP] Japan ................................ 9-155281

[51] Int. Cl.⁷ ....................................... H01L 41/08
[52] U.S. Cl. ......................... 310/366; 310/365; 310/320
[58] Field of Search ................................ 310/366, 320, 310/368, 365

[56] References Cited

U.S. PATENT DOCUMENTS 4,894,580  1/1990  Ogawa ........................... 310/320
5,808,397  9/1998  Kotani ........................... 310/320

FOREIGN PATENT DOCUMENTS 1-288005  11/1989  Japan.
2-235422  10/1990  Japan.
6-125242   5/1994  Japan.

*Primary Examiner*—Nestor Ramirez
*Assistant Examiner*—Peter Medley
*Attorney, Agent, or Firm*—Graham & James LLP

[57] ABSTRACT

A thickness extensional piezoelectric resonator includes a substantially rectangular piezoelectric strip, first and second excitation electrodes disposed on both surfaces of the piezoelectric strip, and an internal electrode disposed inside the piezoelectric strip. The first and second excitation electrodes are located on opposite sides of the piezoelectric strip. The internal electrode is located opposite to the first and second excitation electrodes. Assuming that the piezoelectric plate has a width W and a thickness t, the piezoelectric plate is constructed such that W/d is less than about 6.1 if d=t/n.

19 Claims, 14 Drawing Sheets

FIG. 4
FIG. 5
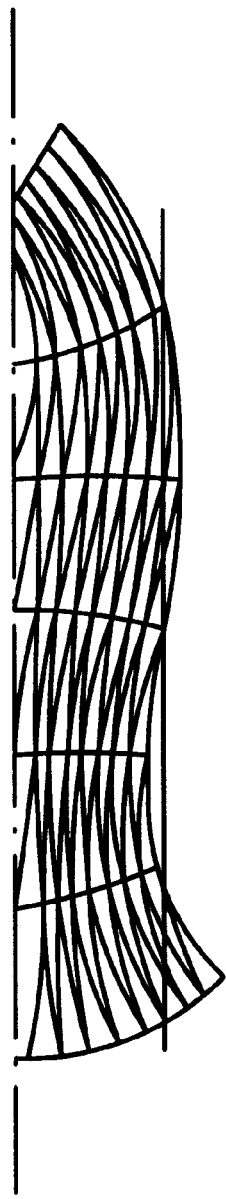
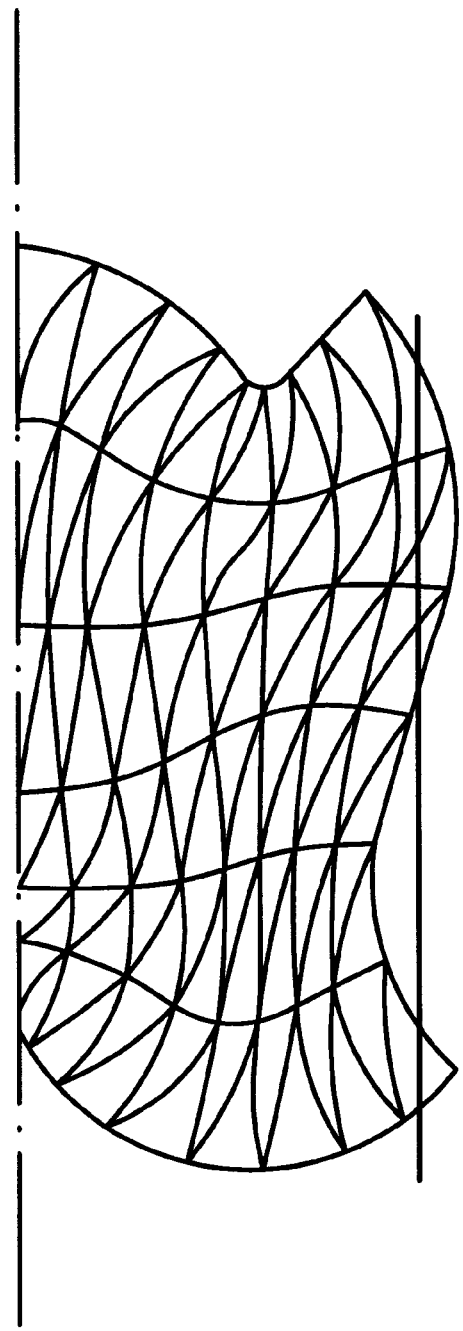

THICKNESS EXTENSIONAL VIBRATION MODE PIEZOELECTRIC RESONATOR

BACKGROUND OF THE INVENTION

1. Field of the Invention

The present invention relates to a piezoelectric resonator used in various resonators, oscillators, and similar devices and, more particularly, to a thickness extensional vibration mode piezoelectric resonator constructed to maximize use of harmonics of a thickness extensional vibration mode.

2. Description of the Related Art

Piezoelectric resonators are used in various piezoelectric resonator components such as piezoelectric oscillators and piezoelectric filters. Known piezoelectric resonators of this kind utilize various piezoelectric vibration modes, depending on the frequency desired.

An energy-trap piezoelectric resonator utilizing the second-order wave of a thickness extensional vibration mode is disclosed in Japanese Unexamined Patent Publication No. 117409/1989. This piezoelectric resonator is now described with reference to FIGS. 21 and 22.

The piezoelectric resonator shown in FIGS. 21 and 22 is constructed by stacking ceramic green sheets 51, 52 made of a piezoelectric material on top of each other and sintering the sheets 51, 52 together, as shown in the exploded perspective view of FIG. 21. A circular excitation electrode 53 is disposed in the center of the ceramic green sheet 51. The excitation electrode 53 is extended to an end of the ceramic green sheet 51 via an extraction electrode 54. A circular excitation electrode 55 is disposed in the center of the top surface of the ceramic green sheet 52. The excitation electrode 55 is extended to an end of the ceramic green sheet 52 via an extraction electrode 56. As shown in the lower projected view of FIG. 21, an excitation electrode 57 is disposed on the bottom surface of the ceramic green sheet 52. The excitation electrode 57 is extended to an end of the ceramic green sheet 52 via an extraction electrode 58. It is noted that the electrodes 53, 55, 57 are only partially formed and only partially cover the respective surfaces of the green sheets 51, 52, respectively at a central portion thereof and do not extend across an entire width or length of the sheets 51, 52. That is, the circular electrodes 53, 55, 57 are surrounded in all directions by the surfaces of the respective green sheets 51, 52.

The ceramic green sheets 51 and 52 are stacked on top of each other and pressure is applied in the direction of thickness thereof. Then, the sheets 51, 52 are sintered, thus producing a sintered body. The sintered body is then polarized. Thus, a piezoelectric resonator 60 is obtained, as shown in FIG. 22.

In the piezoelectric resonator 60, piezoelectric layers 61 and 62 are polarized uniformly in the direction of the arrows, i.e., in the direction of thickness.

When the device shown in FIG. 22 is driven, the excitation electrodes 53 and 57 are connected together, and an AC voltage is applied between the excitation electrodes 53, 57 and the excitation electrode 55. In this way, he piezoelectric resonator 60 is driven to resonate such -that the vibration energy is confined to a region where the excitation electrodes 53, 55, 57 overlap each other, i.e., a resonating portion A.

The prior art piezoelectric resonator 60 which is constructed to use the harmonics of a thickness extensional vibration mode is designed as an energy-trap piezoelectric resonator as mentioned above. Therefore, in order to function as an energy trap type resonator, this resonator 60 requires vibration-attenuating portions which are located so as to surround the resonating portion A in all directions for attenuating vibrations created therein. More specifically, because the circular electrodes 53, 55 and 57 are surrounded by surfaces of the respective green sheets 51, 52 and 52 at which vibration-attenuating portions are located, the vibration-attenuating portions have a large size compared with the size of the resonating portion. The large size and arrangement of vibration-attenuating portions in all directions around the electrodes 53, 55, 57 and resonating portion A are necessary to sufficiently suppress vibrations. Thus, because large vibration-attenuating portions are required to suppress vibrations, it has been difficult to reduce the size of the piezoelectric resonator 60.

On the other hand, Japanese Unexamined Patent Publication No. 235422/1990 discloses an energy-trap piezoelectric resonator that uses a piezoelectric ceramic strip and hardly needs extra piezoelectric substrate portions surrounding the resonating portion to attenuate vibrations.

In this device shown in FIG. 23, an excitation electrode 72a and an excitation electrode 72b are located on the top and bottom major surfaces, respectively, of an elongated piezoelectric substrate 71. The excitation electrodes 72a and 72b extend along the entire width and part of the length of the piezoelectric substrate 71, and are disposed opposite to each other with the piezoelectric substrate 71 located therebetween. The electrodes 72a, 72b overlap each other at an approximately central portion of the piezoelectric substrate 71 to define a resonating portion. The excitation electrodes 72a and 72b extend to longitudinal ends 71a and 71b, respectively, of the piezoelectric substrate 71.

When the piezoelectric resonator 70 is excited into a thickness extensional vibration mode, unwanted vibrations occur due to the dimensional relation between the width W and the thickness T of the piezoelectric substrate 71. Accordingly, Japanese Unexamined Patent Publication No. 235422/1990 discloses that where the fundamental wave is used, W/T=5.33 should be used if the resonance frequency is 16 MHz, and that where the third-order wave is used, setting W/T to approximately 2.87 (where the resonance frequency is approximately 16 MHz) can reduce unwanted spurious waves between resonant and antiresonant frequencies.

As described above, the energy-trap piezoelectric resonator disclosed in Japanese Unexamined Patent Publication No. 117409/1989 and utilizing the second-order wave of a thickness extensional vibration mode needs large vibration-attenuating portions adjacent to the resonating portion. Hence, it is difficult to reduce the size of the resonator.

The energy-trap piezoelectric resonator disclosed in Japanese Unexamined Patent Publication No. 235422/1990 does not require vibration-attenuating portions adjacent to the resonator portion and so a reduction in size can be attained. However, because harmonic waves of a thickness extensional vibration mode are utilized in this resonator, various unwanted spurious waves appear, in addition to the spurious waves between the resonant and antiresonant frequencies. Because this resonator does not have extra portions surrounding the resonating portion, the spurious waves are generated and are not suppressed. As a result, effective and sufficient resonant characteristics can not be achieved in this resonator.

The piezoelectric resonator disclosed in Japanese Unexamined Patent Publication No. 235422/1990 has a relatively small electric capacitance and thus, is susceptible to the effects of stray capacitance of the circuit board or the like.

SUMMARY OF THE INVENTION

To overcome the problems described above, the preferred embodiments of the present invention provide a thickness extensional piezoelectric resonator that maximizes the use of harmonic waves of a thickness extensional vibration mode, has a significantly reduced size, suppresses unwanted spurious vibrations and has excellent resonant characteristics.

The preferred embodiments of the present invention provides a thickness extensional vibration mode piezoelectric resonator utilizing an nth-order harmonic of a thickness extensional vibration mode. The preferred embodiments of the piezoelectric resonator preferably include a piezoelectric plate having first and second surfaces arranged opposite to each other, a first excitation electrode and a second excitation electrode provided on the first and second surfaces, respectively, and arranged opposite to each other with the piezoelectric plate located therebetween, at least one internal electrode disposed in the piezoelectric plate and at least partially located opposite to the first and second excitation electrodes, the opposing portion of the first and second excitation electrodes, the internal electrode and the piezoelectric plate defining a resonating portion, wherein W/d is less than about 6.1 in which d=t/n, where W and t are a width and a thickness of the piezoelectric plate, respectively and n is an integral larger than 1.

With the configuration of the preferred embodiments described above, unwanted spurious vibrations caused by cross-sectional edge vibration modes and harmonics other than the harmonic used in the resonator can be effectively suppressed. As a result, a thickness extensional piezoelectric resonator having excellent resonant characteristics is provided.

Preferably, the ratio of W/d of the above thickness extensional vibration mode piezoelectric preferably satisfies any one of the following ranges:

$W/d \leq 0.8$, $1.0 \leq W/d \leq 2.0$, $2.2 \leq W/d \leq 4.0$, $4.3 \leq W/d \leq 4.8$, $5.7 \leq W/d < 6.1$ When the ratio W/d is set within any one of the five ranges described above, unwanted spurious vibrations caused by cross-sectional edge vibration modes and harmonics other than the harmonic used in the resonator are more effectively suppressed.

In the above thickness extensional vibration mode piezoelectric resonator, the thickness extensional vibration mode piezoelectric resonator may be an energy-trap piezoelectric resonator having the above-described resonating portion and vibration-attenuating portions extending along only one direction, and the first and second excitation electrodes may be provided so as to extend to or close to an end of the piezoelectric plate in a direction that is substantially perpendicular to the one direction. More specifically, in the above thickness extensional vibration mode piezoelectric resonator, no vibration-attenuating portions are provided on opposite sides of the vibrating portion in a direction that is substantially perpendicular to the one direction along which the vibration-attenuating portions are located. As a result, the dimension of the thickness extensional piezoelectric resonator which is perpendicular to the one direction is significantly decreased. Consequently, it is possible to provide a very small sized thickness extensional piezoelectric resonator.

When the resonator is constructed as described above as an energy-trap piezoelectric resonator, attenuation of vibration is performed in only one direction. First and second excitation electrodes are arranged so as to extend to or close to ends of the piezoelectric plate in a direction that is substantially perpendicular to the one direction in which the vibration-attenuating portions extend. Therefore, it is not necessary to provide vibration-attenuating portions at the sides of the resonating portion. Hence, miniaturization of the piezoelectric resonator can be further achieved.

In the above thickness extensional vibration mode piezoelectric resonator, the piezoelectric plate may have a substantially rectangular shape or may have an elongated strip shape.

When an elongated piezoelectric strip shape is used as the piezoelectric plate, miniaturization of the thickness extensional piezoelectric resonator can be further increased, and a thickness extensional piezoelectric resonator can have a further reduced size.

The above thickness extensional vibration mode piezoelectric resonator may further include a capacitor disposed on the first or second surfaces of the piezoelectric plate with a space therebetween to allow for free and unhindered vibration of the piezoelectric resonator.

According to the above structure, a piezoelectric resonator having a built-in capacitor can be provided, using a piezoelectric resonator having none or negligible unwanted spurious vibrations and excellent resonant characteristics.

Other features and advantages of the present invention will become apparent from the following description of the invention which refers to the accompanying drawings.

BRIEF DESCRIPTION OF THE DRAWINGS

FIG. 4 is a diagram illustrating the distribution of displacements of a piezoelectric plate vibrating in a cross-sectional edge mode $SE_0$ analyzed by the finite element method;

FIG. 5 is a diagram illustrating the distribution of displacements of a piezoelectric plate vibrating in a cross-sectional edge mode $SE_1$ analyzed by the finite element method;

DETAILED DESCRIPTION OF PREFERRED EMBODIMENTS

Figure 1:
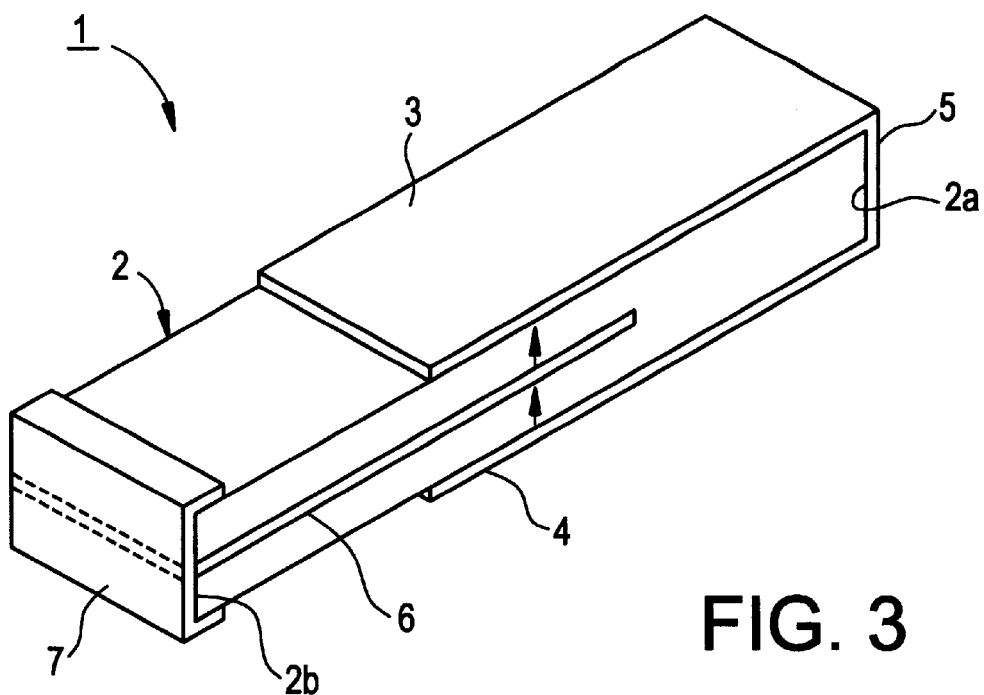
FIG. 1 is a perspective view showing a thickness extensional piezoelectric resonator according to a first preferred embodiment of the invention.
Figure 2:
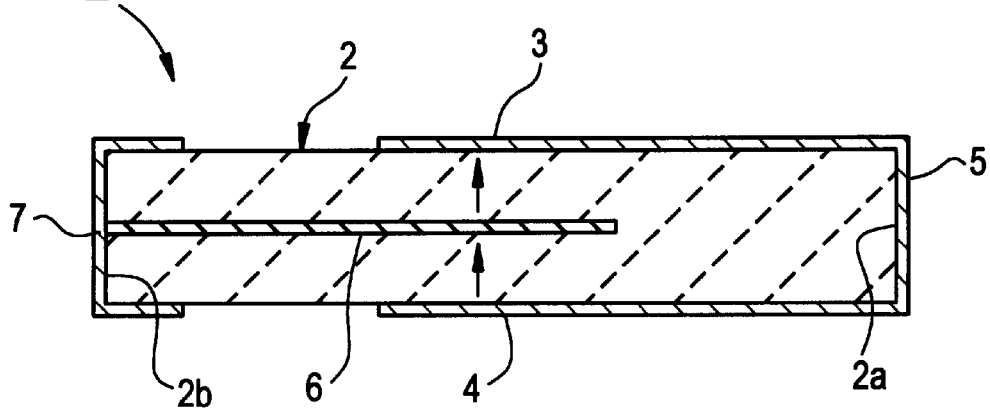
FIG. 2 is a cross-sectional view of the thickness extensional piezoelectric resonator according to the first preferred embodiment.
Figure 6:
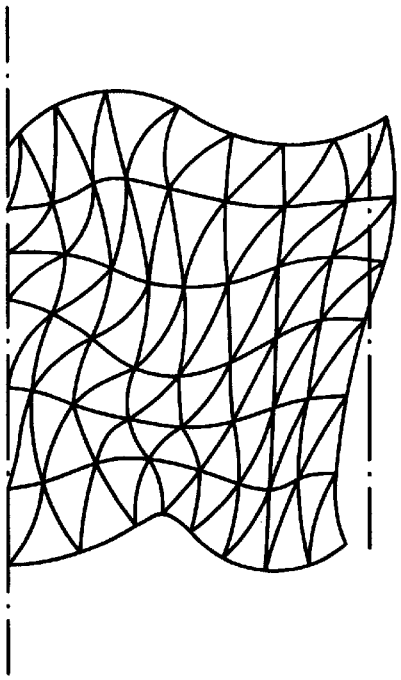
FIG. 6 is a diagram illustrating the distribution of displacements of a piezoelectric plate vibrating in a cross-sectional edge mode $SE_2$ analyzed by the finite element method.
Figure 7:
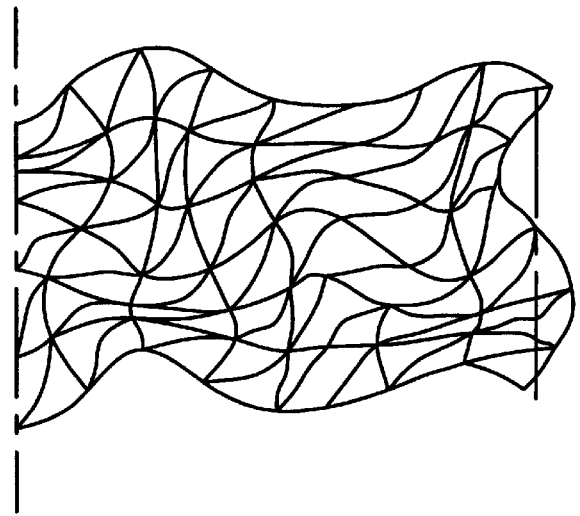
FIG. 7 is a diagram illustrating the distribution of displacements of a piezoelectric plate vibrating in a cross-sectional edge mode $SE_3$ analyzed by the finite element method.
Figure 8:
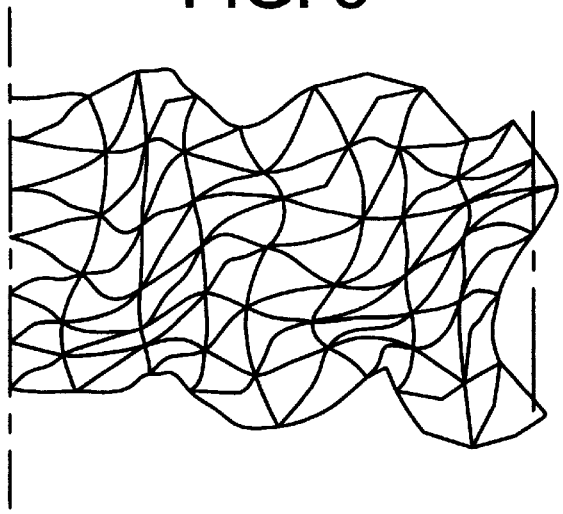
FIG. 8 is a diagram illustrating the distribution of displacements of a piezoelectric plate vibrating in a cross-sectional edge mode $SE_4$ analyzed by the finite element method.

FIG. 1 is a perspective view showing a thickness extensional piezoelectric resonator according to a first preferred embodiment of the present invention. FIG. 2 is a cross-sectional view of the resonator shown in FIG. 1.

A thickness extensional piezoelectric resonator 1 is preferably made of an elongated piezoelectric strip 2 preferably made of a piezoelectric ceramic such as a lead zirconate titanate-based ceramic. Assuming that the piezoelectric plate 2 has a width W and a thickness t, W/d is preferably set less than about 6.1 if d=t/n.

The piezoelectric strip 2 is polarized uniformly in the direction of thickness as indicated by the arrows in FIG. 1. A first excitation electrode 3 is located on the top surface of the piezoelectric strip 2. A second excitation electrode 4 is disposed on the bottom surface. Excitation electrodes 3 and 4 extend from one end 2a of the piezoelectric strip 2 to the other end 2b at the top and bottom surfaces of the piezoelectric strip 2.

The excitation electrodes 3 and 4 are connected together by a connecting electrode 5 disposed on the end surface 2a of the piezoelectric strip 2.

An internal electrode 6 is disposed at a middle level within the piezoelectric strip 2. The internal electrode 6 is extended to the end surface 2b of the piezoelectric strip 2, and is electrically connected with a terminal electrode 7 located on the end surface 2b.

During operation of the resonator, an AC voltage is applied between the first and second excitation electrodes 3, 4 and the internal electrode 6, thus inducing the second-order wave of the thickness extensional vibration mode strongly. Thus, the resonator 1 can be used as a piezoelectric resonator utilizing the second-order wave.

In the present preferred embodiment, the first and second excitation electrodes 3 and 4 are preferably overlapped over the internal electrode 6 via the piezoelectric layer at a substantially central portion of the piezoelectric strip 2. Therefore, in the portion where the internal electrode 6 overlaps the first and second excitation electrodes 3, 4, an energy-trap resonating portion is formed. When this resonating portion is resonating, the energy is attenuated by the piezoelectric portions extending along a length of the piezoelectric strip 2 from the resonating portion to the end surfaces 2a and 2b.

If the above-described resonating portion is considered to be located at the substantially central portion, vibration-attenuating portions are located only at longitudinally opposite sides of the substantially central portion and extend only in the longitudinal direction (first direction) of the piezoelectric strip 2. The first and second excitation electrodes 3, 4 extend to the ends of the piezoelectric strip 2 in a direction that is substantially perpendicular to the longitudinal direction, i.e., substantially perpendicular to the longitudinal ends.

In this case, the first and second excitation electrodes 3, 4 and the internal electrode 6 are required to extend along the whole width of the piezoelectric strip 2 only at the resonating portion 6. Outside the resonating portion, the full width is not always required to be maintained. For example, the excitation electrode 3 only needs to extend along the whole width of the piezoelectric strip 2 only in the resonating portion. The portion of the excitation electrode 3 on the side of the end surface 2a may be thinner, because it simply electrically connects the excitation electrode 3 with the connecting electrode 5.

Unlike the prior art strip-type thickness extensional piezoelectric resonator, the thickness extensional piezoelectric resonator 1 according to preferred embodiments of the present invention effectively suppresses unwanted spurious vibrations caused by lateral-mode vibrations, as will be described by referring to FIG. 24 and FIGS. 3–11.

Figure 23:
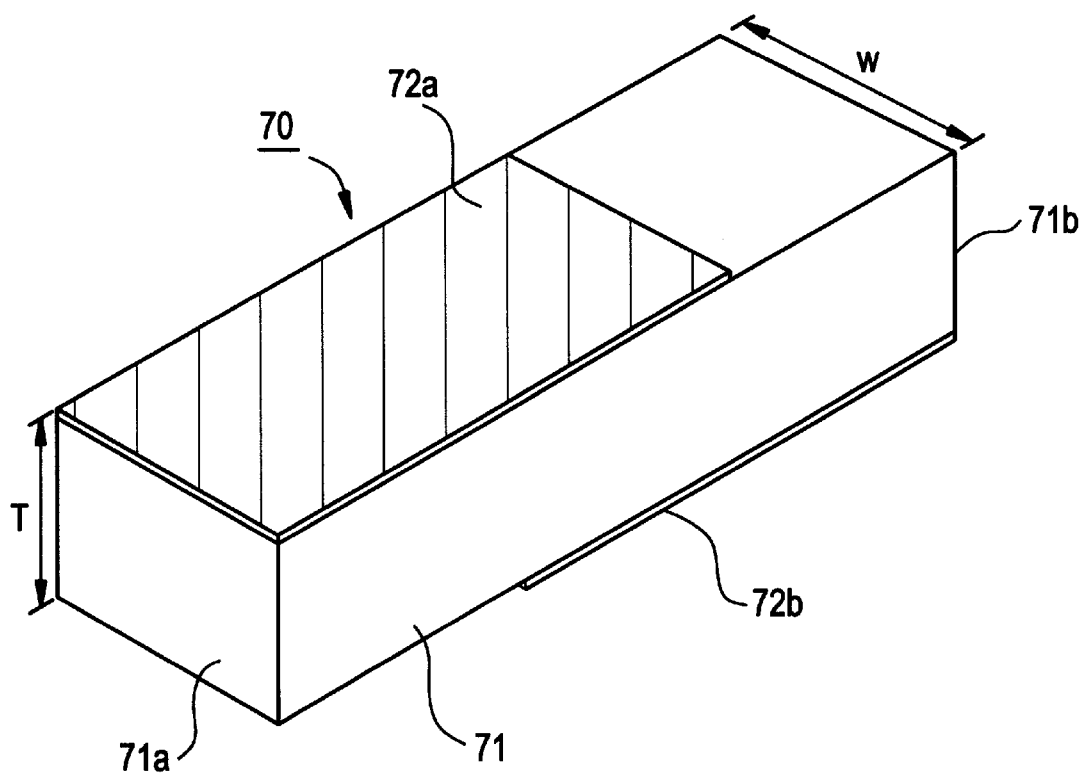
FIG. 23 is a perspective view illustrating another example of a prior art thickness extensional piezoelectric resonator.
Figure 24:
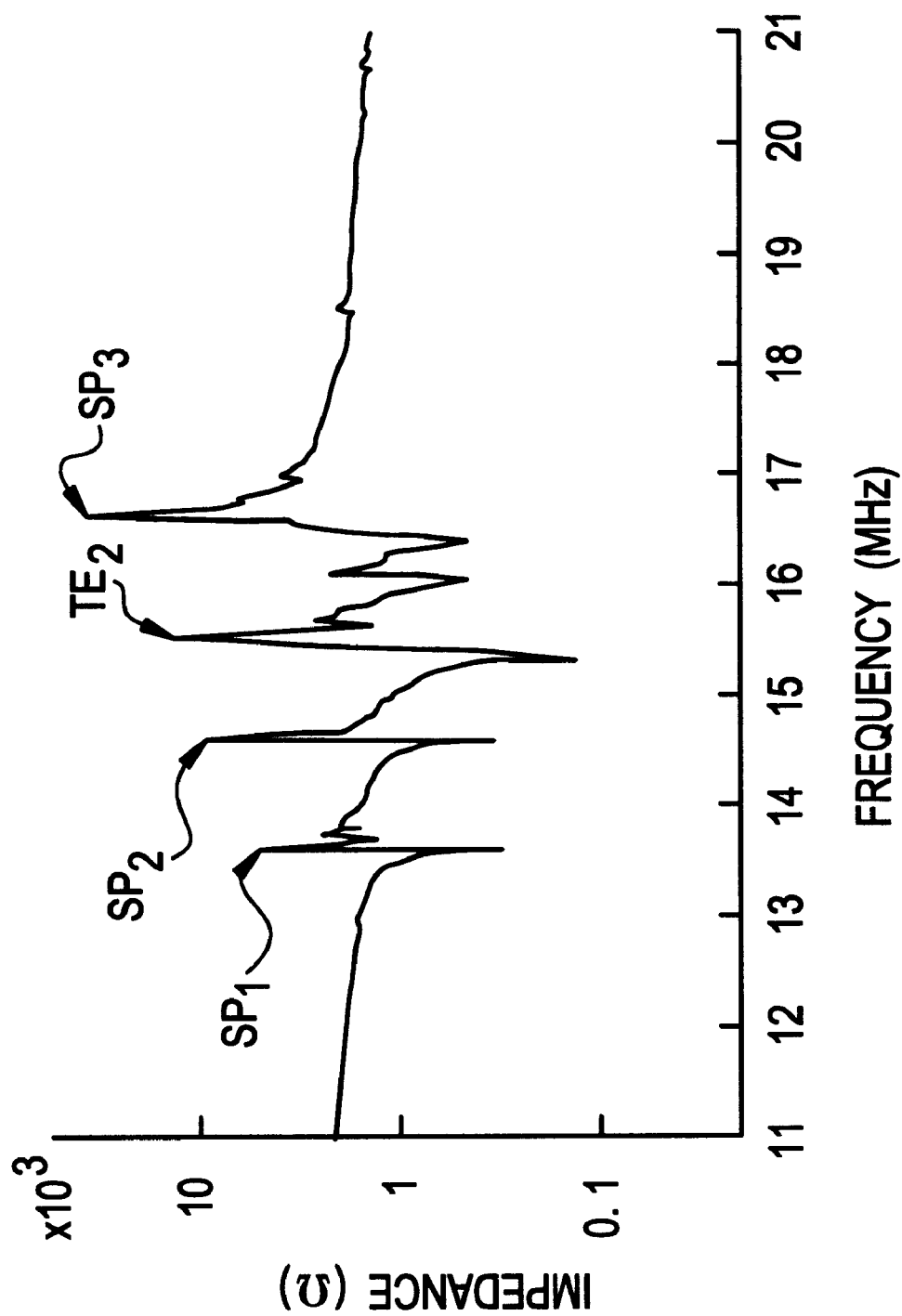
FIG. 24 is a diagram illustrating the impedance-frequency characteristic of the prior art thickness extensional piezoelectric resonator.

It was determined that the prior art strip-type piezoelectric resonator 70 shown in FIG. 23 produces strong resonance generated by the cross-sectional edge vibration mode of the piezoelectric substrate 71. FIG. 24 shows the impedance-frequency characteristic of this prior art piezoelectric resonator 70.

In FIG. 24, a vibration mode indicated by the arrow $TE_2$ is the second-order wave of a thickness extensional vibration mode. Responses indicated by $SP_1$–$SP_3$ are spurious vibrations caused by the cross-sectional edge vibration mode. The impedance-frequency characteristic shown in FIG. 24 is derived from the piezoelectric resonator 70 having a resonance frequency of 16 MHz. As can be seen from FIG. 24, spurious vibrations indicated by $SP_1$, $SP_2$, and $SP_3$ appear near 13.5, 14.5, and 16.5 MHz, respectively. It is observed that every spurious vibration is considerably large.

Figure 3:
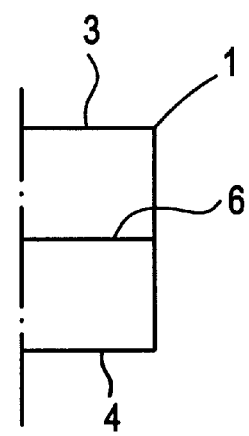
FIG. 3 is a cross sectional view of a half of the piezoelectric resonator having a displacement distribution shown in FIGS. 4–8.

The displacements of the piezoelectric resonator at the spurious vibrations described above were analyzed and the results of this analysis are shown in FIGS. 4–8. FIGS. 4–8 are horizontal cross sections of a thickness extensional piezoelectric resonator 1 having a strip shape as shown in FIG. 3, schematically showing, on an enlarged scale, the displacements of a surface of a half of the strip-type piezoelectric resonator 1 when taken in a direction that is substantially perpendicular to the longitudinal direction and in the direction of thickness.

FIGS. 4–8 are modes of displacements of cross-sectional edge modes and referred to as $SE_0$–$SE_4$, respectively. It is considered that the $SP_1$, $SP_2$, and $SP_3$ are either based on cross-sectional edge mode spurious vibration $SE_2$ or accompany it.

The inventors of the present application discovered that spurious vibrations caused by the cross-sectional edge modes $SEo$-$SE_4$ described above are significantly suppressed if the ratio W/d is set to a certain value under conditions where the piezoelectric plate 2 has a width W and a thickness t and d=t/n. The inventors also determined that the responses of the cross-sectional edge modes can be significantly reduced and that vibration in the piezoelectric strip could be controlled such that only the second-order wave $TE_2$ of the thickness extensional vibration mode is excited strongly. That is, FIGS. 9 and 10 show the impedance-frequency characteristics of the piezoelectric plate 1 under conditions where the ratio W/d is approximately equal to 4.2 and 2.8, respectively, the characteristics having been analyzed by the finite element method.

Figure 9:
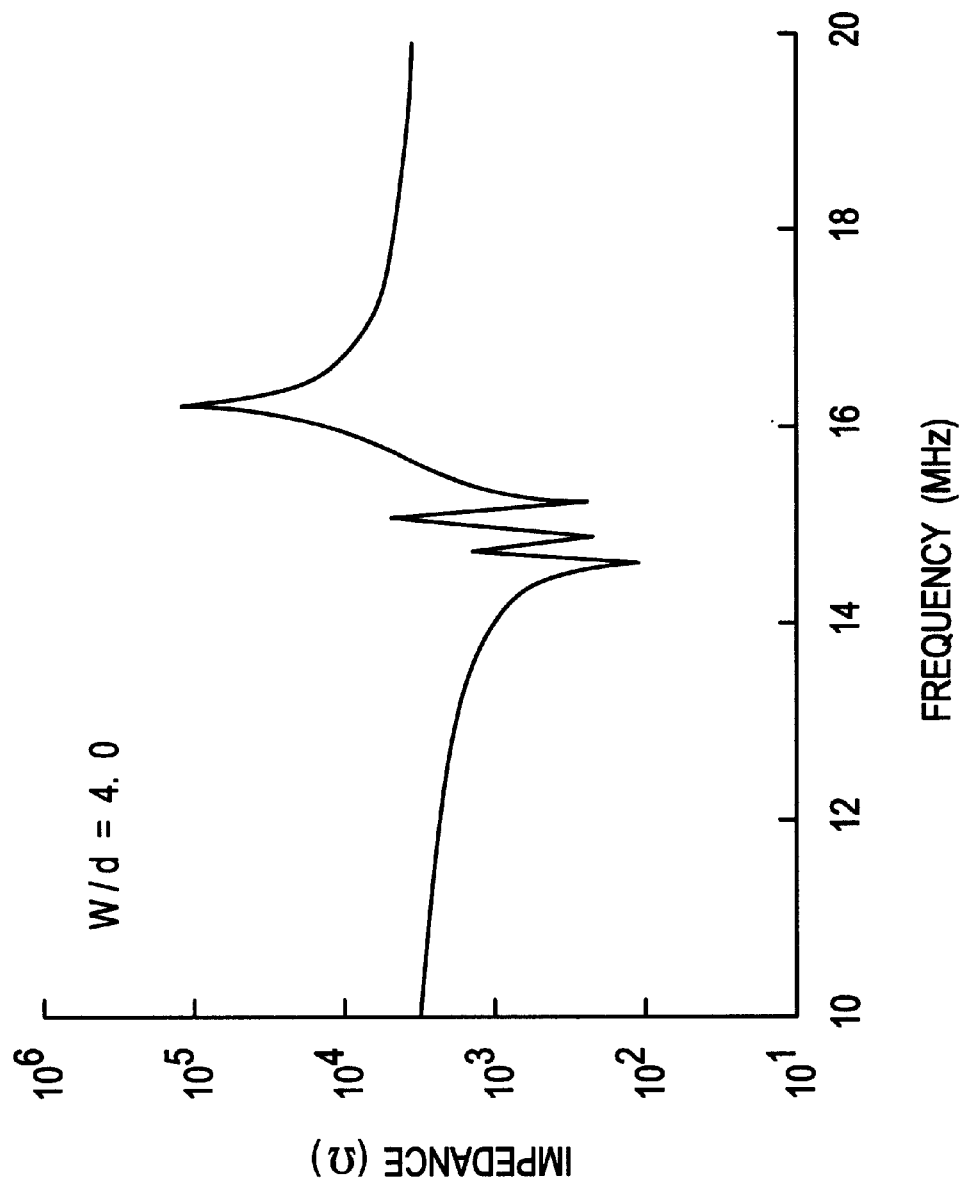
FIG. 9 is a diagram illustrating the impedance-frequency characteristic of the thickness extensional piezoelectric resonator where a ratio W/d is about 4.2 and analysis is made by the finite element method.
Figure 10:
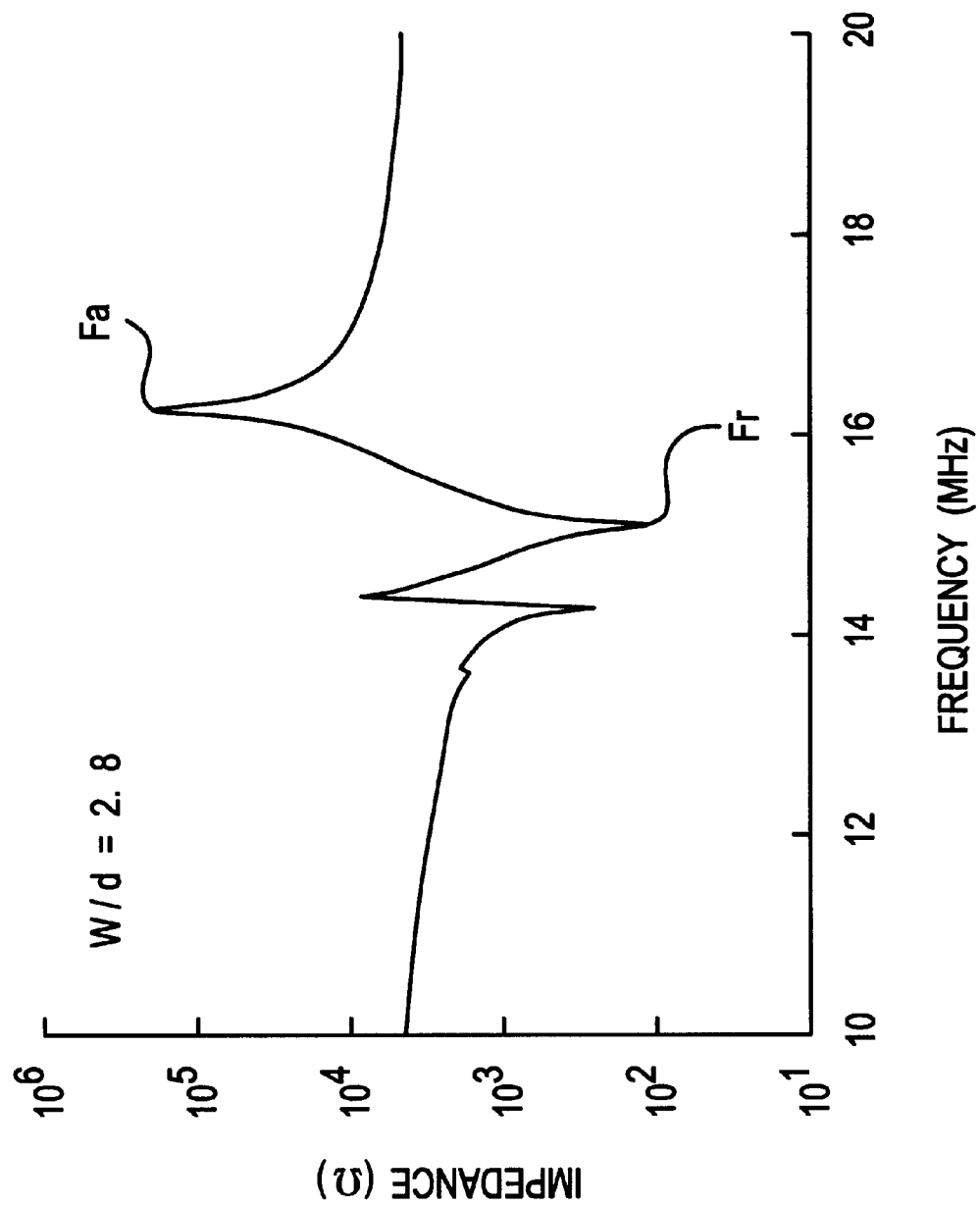
FIG. 10 is a diagram illustrating the impedance-frequency characteristic of the thickness extensional piezoelectric resonator where a ratio W/d is about 2.8 and analysis is made by the finite element method.

As can be seen from FIG. 9, where W/d is about 4.2, a cross-sectional edge mode $SE_2$ and associated modes appear strongly in the passband between a resonant point fr and an antiresonant point fa. As shown in FIG. 10, where W/d is about 2.8, no large cross-sectional edge mode spurious vibrations appear near the passband between the resonant point fr and the antiresonant point fa.

An actual example of the above described preferred embodiment of the piezoelectric resonator 1 was manufactured such that W/d was approximately equal to 2.8 and the example was analyzed according to the finite element method. The impedance-frequency characteristic was measured, and results shown in FIG. 11 were obtained.

Figure 11:
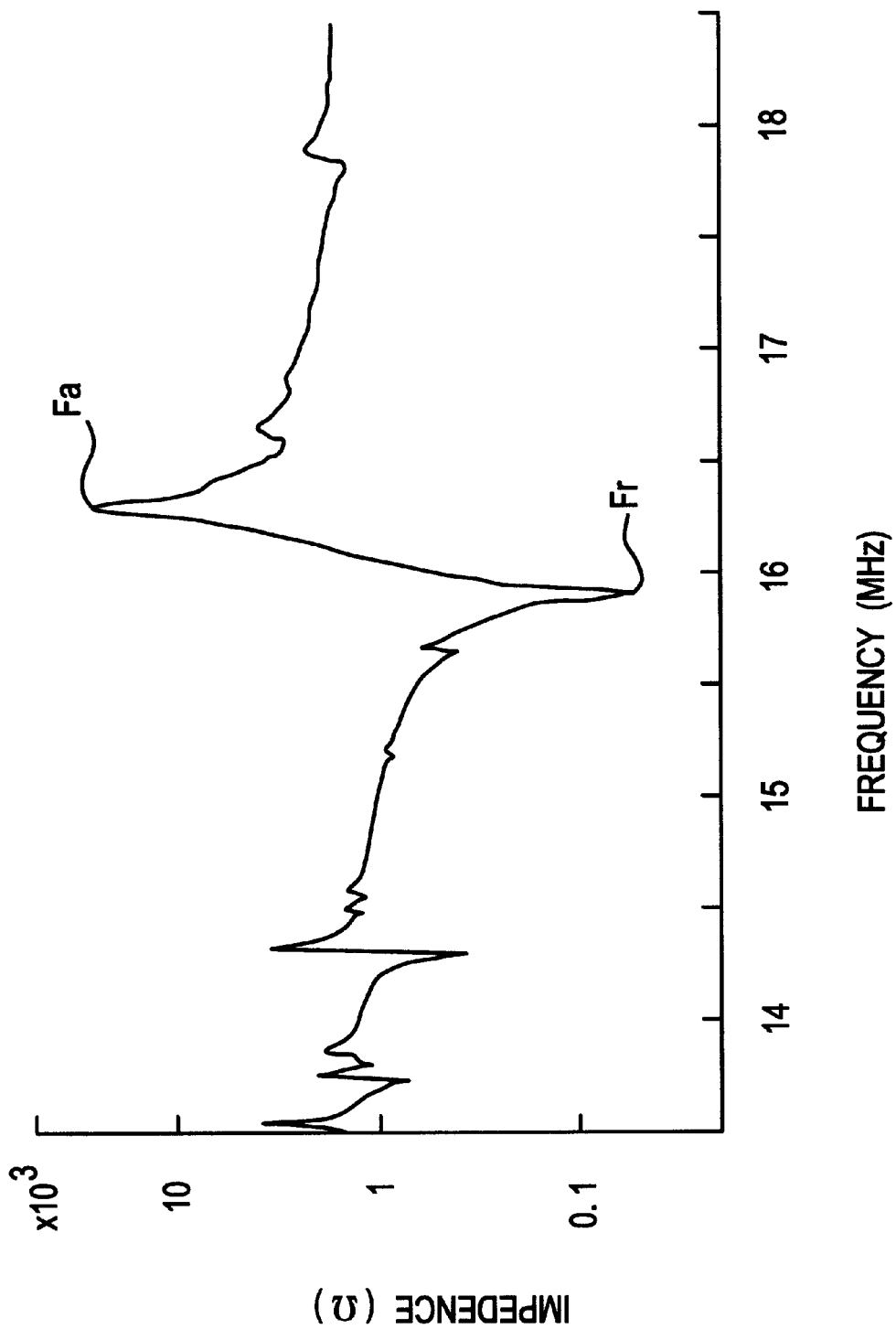
FIG. 11 is a diagram illustrating the impedance-frequency characteristic of the thickness extensional piezoelectric resonator according to a first preferred embodiment of the present invention.

As can be seen from FIG. 11, almost no spurious vibrations caused by cross-sectional edge modes appear near the passband between the resonant point fr and the antiresonant point fa.

Where the ratio W/d described above was varied, good resonant characteristics were obtained as shown in FIG. 11. In view of this, the frequency constants of the modes obtained where the ratio was varied W/d were confirmed by the finite element method. Results shown in FIG. 12 were obtained.

The frequency constant referred to herein is the antiresonant frequency fa multiplied by d to make the frequency a constant.

Figure 12:
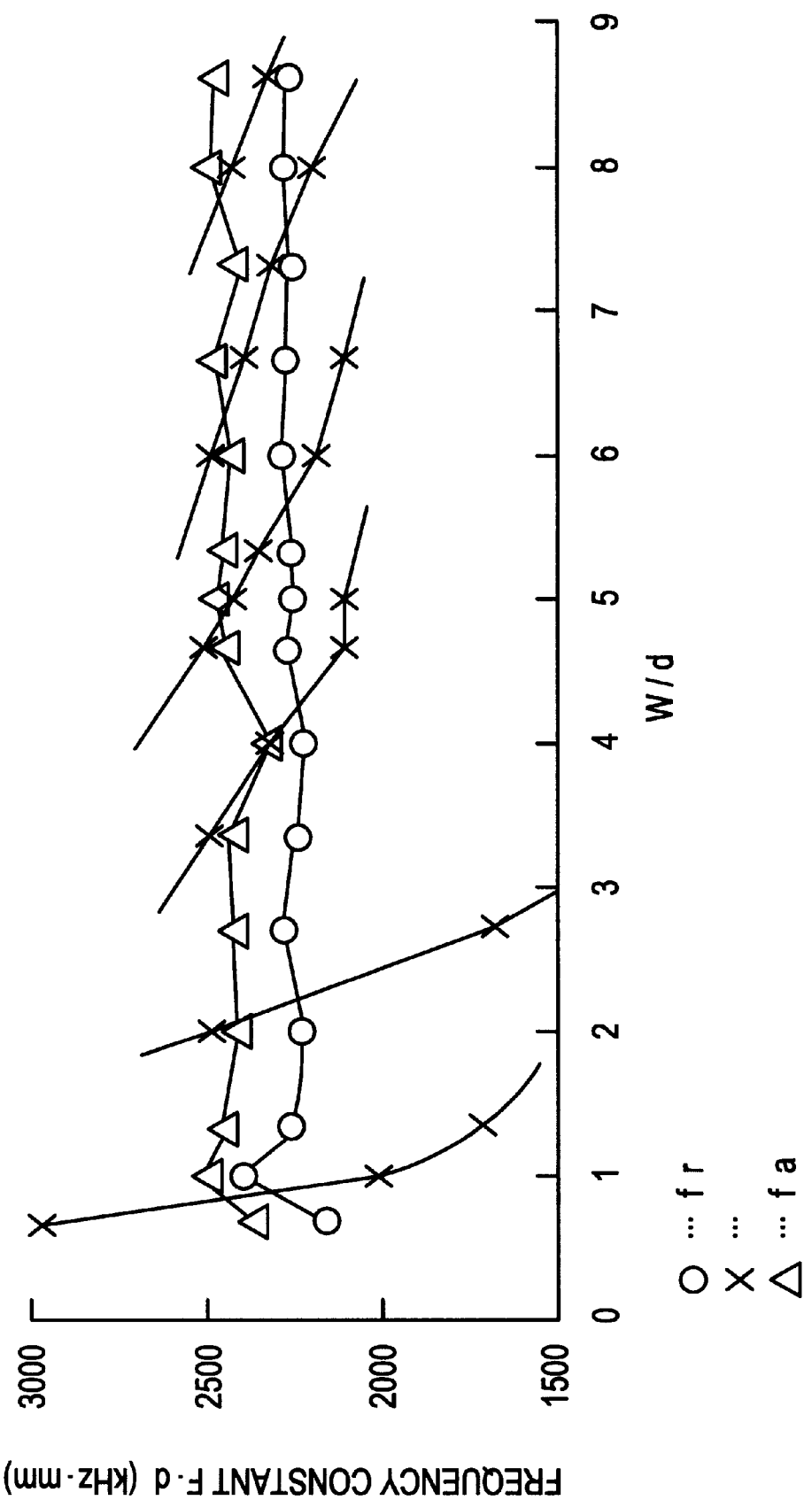
FIG. 12 is a diagram illustrating the relationship between the absolute value of the ratio W/d and relative bandwidth.

As can be seen from FIG. 12, where the ratio W/d is changed, the relative bandwidth varies. Especially, where the W/d is in excess of about 6, resonant points of vibrations caused by cross-sectional edge vibration modes (indicated by X in FIG. 12) appear in the passband. Where the ratio W/d is less than about 6.1, a thickness extensional piezoelectric resonator that is not susceptible to vibrations caused by cross-sectional edge vibration modes can be derived by appropriately selecting the value of the ratio W/d. Especially, where the ratio W/d is set within the ranges of Equations. (1)–(5), the resonance caused by the cross-sectional edge vibration mode indicated by X is not located within the passband between the resonant point (○) and antiresonant point (Δ). Therefore, excellent resonant characteristics are obtained.

In the thickness extensional piezoelectric resonator 1 according to the present preferred embodiment, the ratio W/d of the piezoelectric plate 2 is preferably set to be less than about 6.1 as mentioned above. Therefore, where a piezoelectric resonator utilizing the second-order wave $TE_2$ of a thickness extensional vibration mode is constructed, unwanted spurious vibrations caused by cross-sectional edge vibration modes are effectively suppressed. As a result, excellent resonant characteristics are achieved.

In the thickness extensional piezoelectric resonator 1 according to the first preferred embodiment, the piezoelectric strip 2 is polarized uniformly in the direction of thickness. The piezoelectric resonator 1 is connected in a parallel configuration such that the applied electric field is reversed with each of the successive layers. The preferred embodiments of the present invention may also be applied to a series-connection type piezoelectric resonator in which plural piezoelectric layers are alternately polarized oppositely in the direction of thickness. A thickness extensional piezoelectric resonator of such a series type is shown in FIG. 13.

Figure 13:
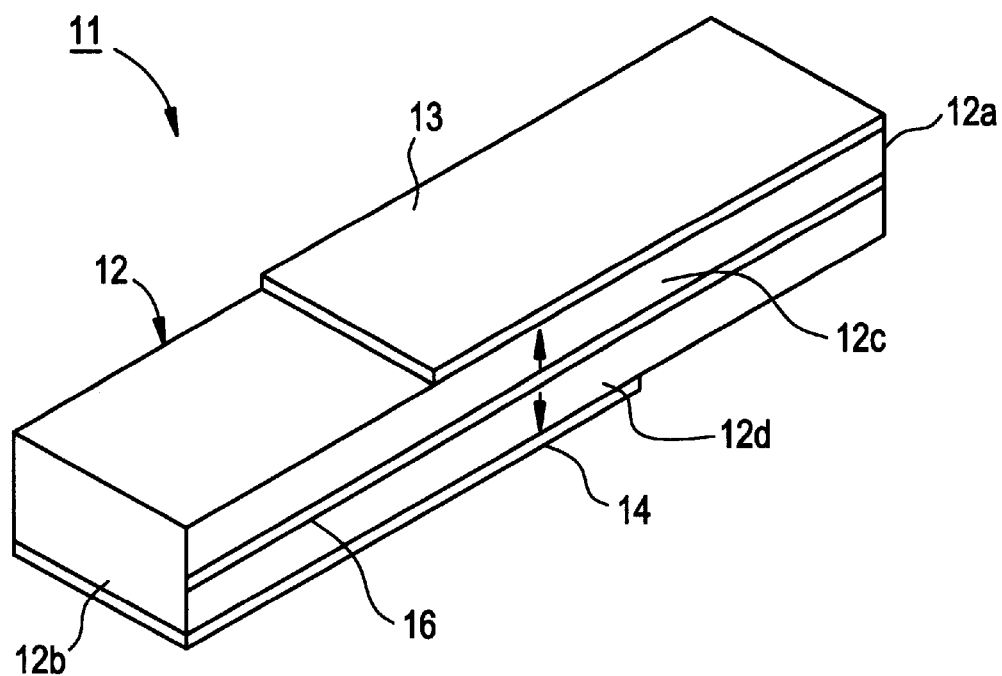
FIG. 13 is a perspective view illustrating a thickness extensional piezoelectric resonator according to a second preferred embodiment.

A thickness extensional piezoelectric resonator 11 shown in FIG. 13 is preferably made of an elongated substantially rectangular piezoelectric strip 12. A first excitation electrode 13 is disposed on the top surface of the piezoelectric strip 12. A second excitation electrode 14 is disposed on the bottom surface of the piezoelectric strip. The first and second excitation electrodes 13 and 14, respectively, are located on opposite sides of the piezoelectric strip 12. The first and second excitation electrodes 13 and 14 are arranged opposite to each other at the substantially central portion of the piezoelectric strip 12 with the piezoelectric strip 12 located therebetween. The portion where the first and second excitation electrodes 13 and 14 are opposite to each other makes an energy-trap resonating portion.

Also, in the present preferred embodiment, the first and second excitation electrodes 13 and 14 are extended to end surfaces 12a and 12b, respectively, of the piezoelectric strip 12. The portions other than the resonating portion are not required to extend along the whole length of the piezoelectric strip 12.

From a different viewpoint, the excitation electrodes 13 and 14 define an energy-trap resonating portion having vibration-attenuating portions in the longitudinal direction of the piezoelectric strip 12. For this purpose, the first and second excitation electrodes 13 and 14 extend to the longitudinal ends of the piezoelectric strip 12 in a direction that is substantially perpendicular to the longitudinal direction.

An internal electrode 16 is located at a middle portion within the piezoelectric strip 12 and functions to polarize the piezoelectric strip 12. That is, during polarization, piezoelectric layers 12c and 12d are polarized in opposite directions in the direction of thickness as indicated by the arrows by applying a higher voltage and a lower voltage to the internal electrode 16 and the excitation electrodes 13, 14, respectively.

During operation, an AC voltage is applied between the first and second excitation electrodes 13 and 14, respectively. That is, the internal electrode 16 is not used for the operation of resonator. The second-order wave $TE_2$ of a thickness extensional vibration mode can be excited.

In the same way as the thickness extensional vibration mode piezoelectric resonator 1 according to the first preferred embodiment, the thickness extensional vibration mode piezoelectric resonator 11 according to the second preferred embodiment can effectively suppress unwanted spurious vibrations caused by cross-sectional edge vibration modes, since the ratio W/d is set within any one of the five ranges described above. As a result, excellent resonant characteristics are obtained.

The first and second preferred embodiments provide piezoelectric resonators 1 and 11 both utilizing the second-order wave of a thickness extensional vibration mode. Piezoelectric resonators in accordance with preferred embodiments of the present invention may make use of harmonics other than the second-order wave of a thickness extensional vibration mode. FIGS. 14–17 are cross-sectional views illustrating piezoelectric resonators utilizing these other harmonics, and correspond to FIG. 2 used to describe the first preferred embodiment.

Figure 14:
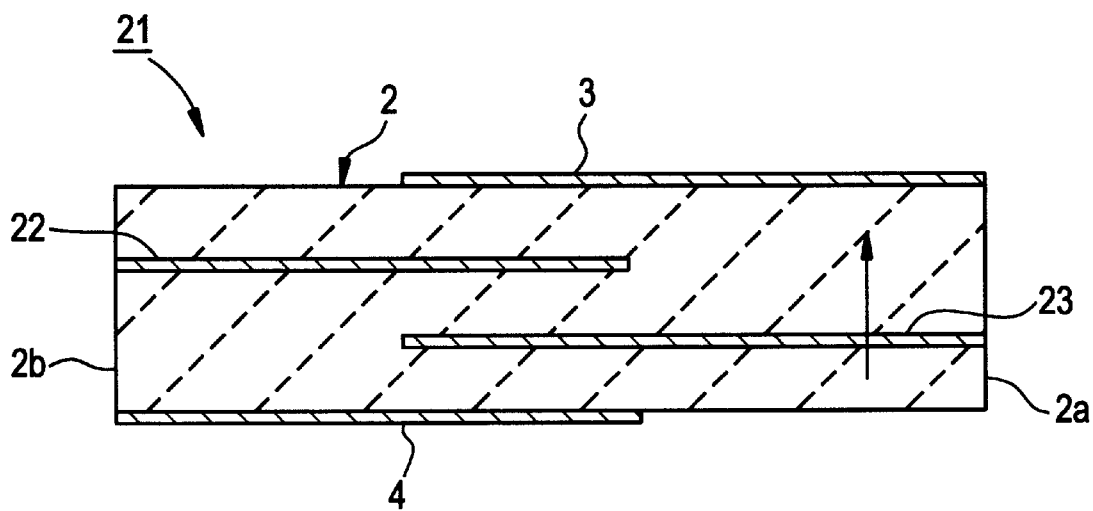
FIG. 14 is a cross-sectional view showing a first modified example of a thickness extensional piezoelectric resonator according to preferred embodiments of the present invention.

FIG. 14 is a parallel-connection type thickness extensional piezoelectric resonator, 21, utilizing a third-order wave of a thickness extensional vibration mode. In particular, two internal electrodes 22 and 23 are disposed in a piezoelectric body 2. The piezoelectric body 2 is polarized uniformly in the direction of thickness as indicated by the arrow in FIG. 14. Thus, the piezoelectric resonator 21 using the third-order wave of a thickness extensional vibration mode can be built.

Figure 15:
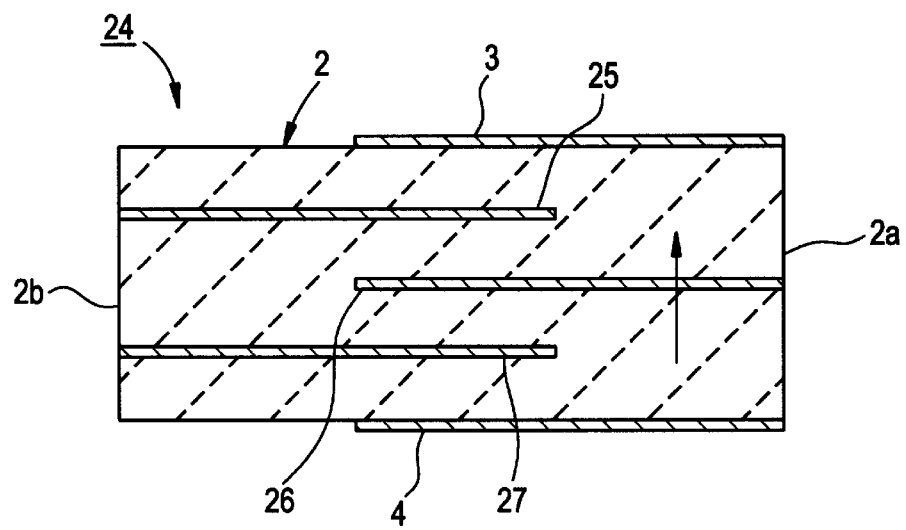
FIG. 15 is a cross-sectional view showing a second modified example of a thickness extensional piezoelectric resonator according to the preferred embodiments of the present invention.

A thickness extensional piezoelectric resonator 24 shown in FIG. 15 is a cross-sectional view showing a parallel-connection type piezoelectric resonator 24 utilizing the fourth-order wave of a thickness extensional vibration mode. In the thickness extensional piezoelectric resonator 24, the piezoelectric strip 2 is polarized uniformly in the direction of thickness. Three internal electrodes 25–27 are regularly spaced from each other in the direction of thickness inside the resonator. Consequently, the fourth-order wave of a thickness extensional vibration mode is effectively excited.

Figure 16:
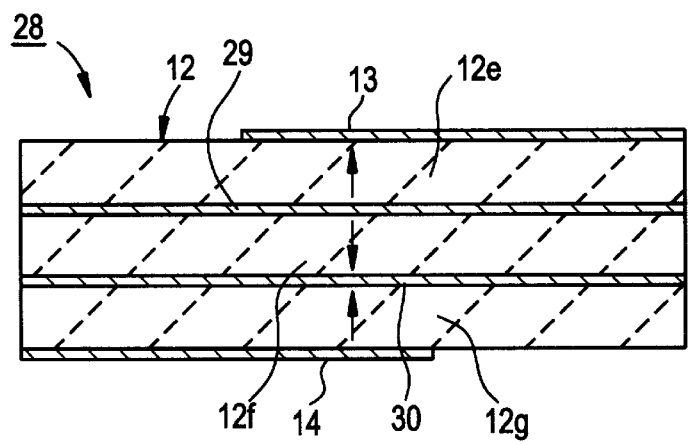
FIG. 16 is a cross-sectional view showing a third modified example of a thickness extensional piezoelectric resonator according to the preferred embodiments of the present invention.

FIG. 16 is a cross-sectional view showing a series-connection type thickness extensional piezoelectric resonator, 28, utilizing the third-order wave of a thickness extensional vibration mode. In this thickness extensional piezoelectric resonator 28, two internal electrodes 29 and 30 are disposed in a piezoelectric body 12. The inside of the piezoelectric body 12 is divided into three piezoelectric layers 12e–12g. Polarization is performed, using these internal electrodes 29 and 30, so that piezoelectric layers which are adjacent to each other in the direction of thickness are polarized in opposite directions. Thus, the third-order wave of a thickness extensional vibration mode can be excited by applying an AC voltage to the first and second excitation electrodes 13 and 14.

Figure 17:
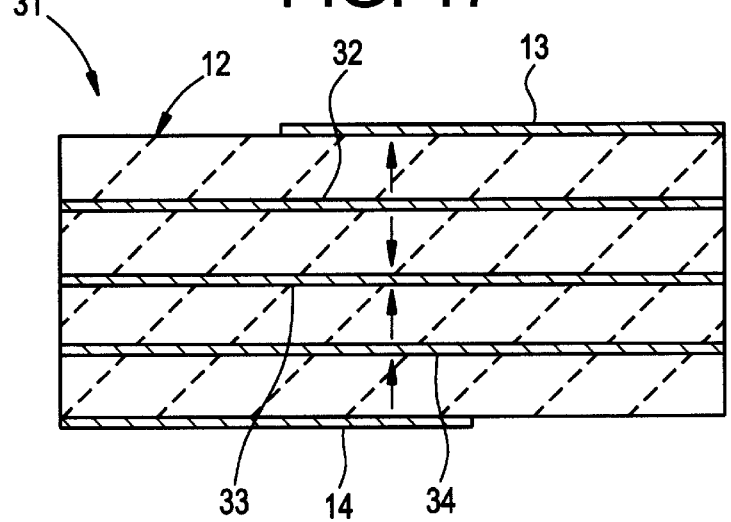
FIG. 17 is a cross-sectional view showing a fourth modified example of a thickness extensional piezoelectric resonator according to the preferred embodiments of the present invention.

Similarly, FIG. 17 is a cross-sectional view showing a series-connection type piezoelectric resonator 31 utilizing the fourth-order wave of a thickness extensional vibration mode. Here, three internal electrodes 32–34 are disposed in a piezoelectric body 12. Polarization is carried out, using these internal electrodes 32–34, such that piezoelectric layers which are adjacent to each other in the direction of thickness are polarized in opposite directions.

Therefore, it can be operated as a piezoelectric resonator utilizing the fourth-order wave of a thickness extensional vibration mode by applying an AC voltage to the first and second excitation electrodes 13, 14.

Also, in the thickness extensional piezoelectric resonators shown in FIGS. 14–17, the ratio W/d is set within any one of the five ranges described above. Therefore, harmonics of a thickness extensional vibration are used in the same way as the first and second preferred embodiments. Furthermore, unwanted spurious vibrations caused by responses of cross-sectional edge vibration modes or other harmonics can be effectively suppressed.

Figure 18:
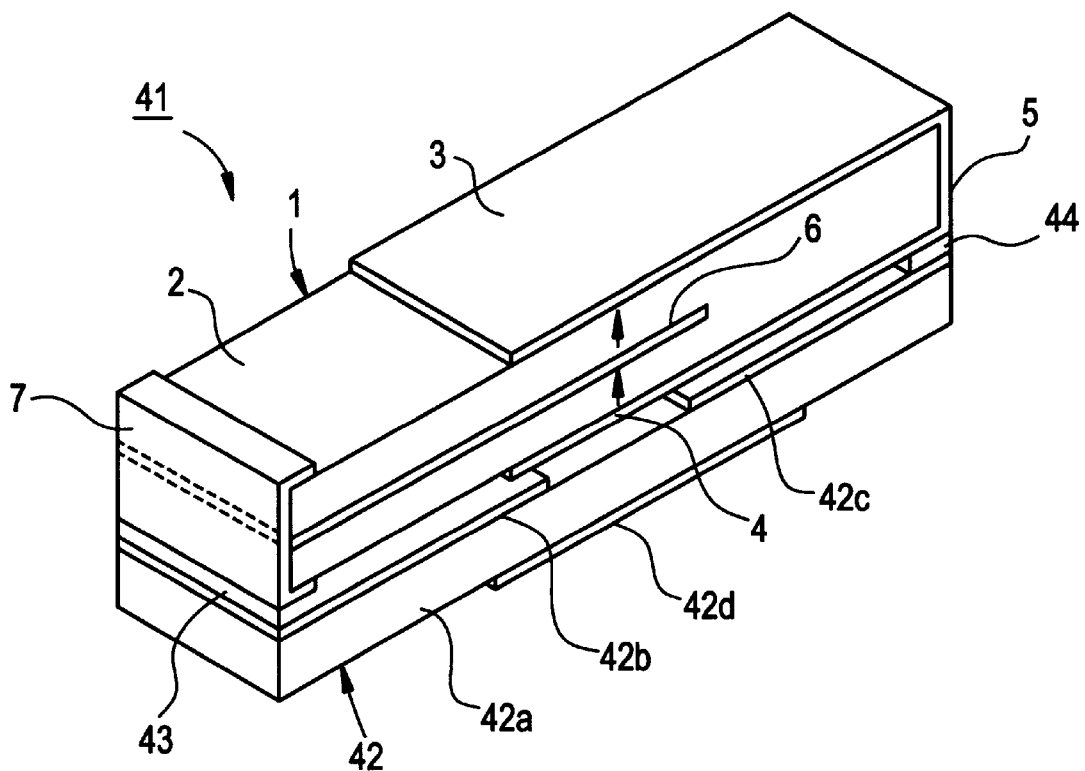
FIG. 18 is a perspective view showing a piezoelectric resonator having a built-in capacitor, the resonator being built according to the third preferred embodiment of the present invention.
Figure 19:
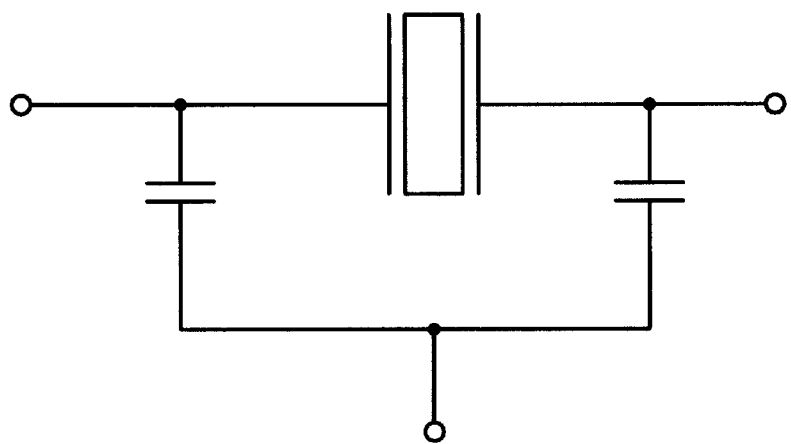
FIG. 19 is a diagram showing the circuit configuration of the piezoelectric resonator shown in FIG. 18.

FIG. 18 is a perspective view for illustrating a thickness extensional piezoelectric resonator according to a third preferred embodiment of the invention. FIG. 19 is a diagram showing an equivalent circuit of the third preferred embodiment. FIG. 18 shows a piezoelectric resonator 41 that is a combination of the thickness extensional piezoelectric resonator 1 according to the first preferred embodiment and a capacitor 42. This capacitor 42 is bonded to the bottom surface of the thickness extensional piezoelectric resonator 1 via conductive adhesive 43, 44.

In the capacitor 42, capacitive electrodes 42b and 42c are located near a gap at the top surface of a dielectric substrate 42a. A common electrode 42d is located on the bottom surface of the dielectric substrate 42a. The common electrode 42d and the capacitive electrodes 42b, 42c are located on opposite sides of the dielectric substrate 42a.

The conductive adhesive 43 bonds the capacitive electrode 42b to a terminal electrode 7. The conductive adhesive 44 bonds the capacitive electrode 42c to a terminal electrode 5.

Therefore, as shown in FIG. 19, the piezoelectric resonator 41 can be used as a piezoelectric resonator incorporating two capacitive units.

Thus, the thickness extensional piezoelectric resonator 1 is a piezoelectric resonator utilizing the second-order waves of thickness extensional vibrations. Spurious vibrations caused by cross-sectional edge modes can be effectively suppressed. Therefore, piezoelectric resonators having excellent frequency characteristics can be provided.

Figure 20:
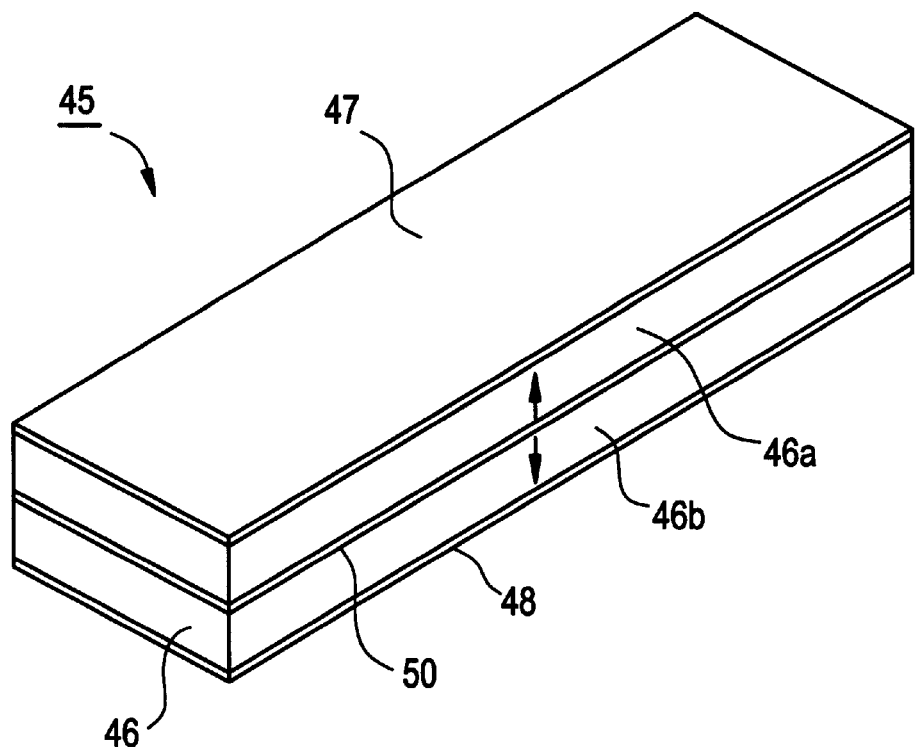
FIG. 20 is a perspective view illustrating a further modified example of a thickness extensional piezoelectric resonator according to preferred embodiments of the present invention.
Figure 22:
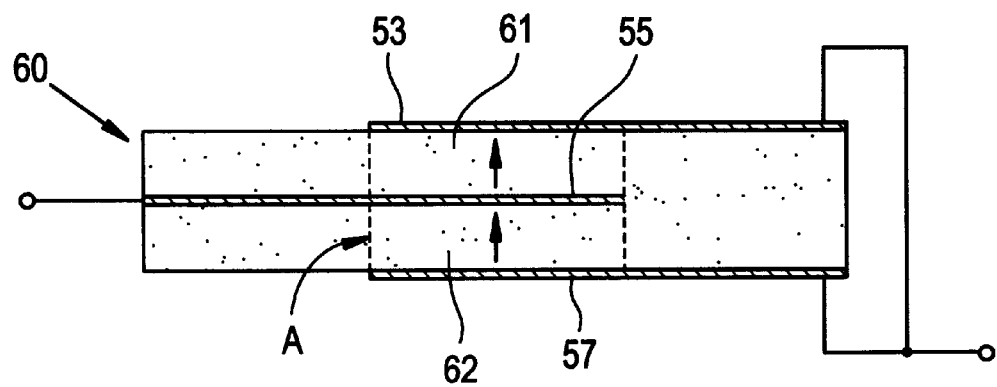
FIG. 22 is a cross-sectional view of the thickness extensional piezoelectric resonator shown in FIG. 21.
Figure 21:
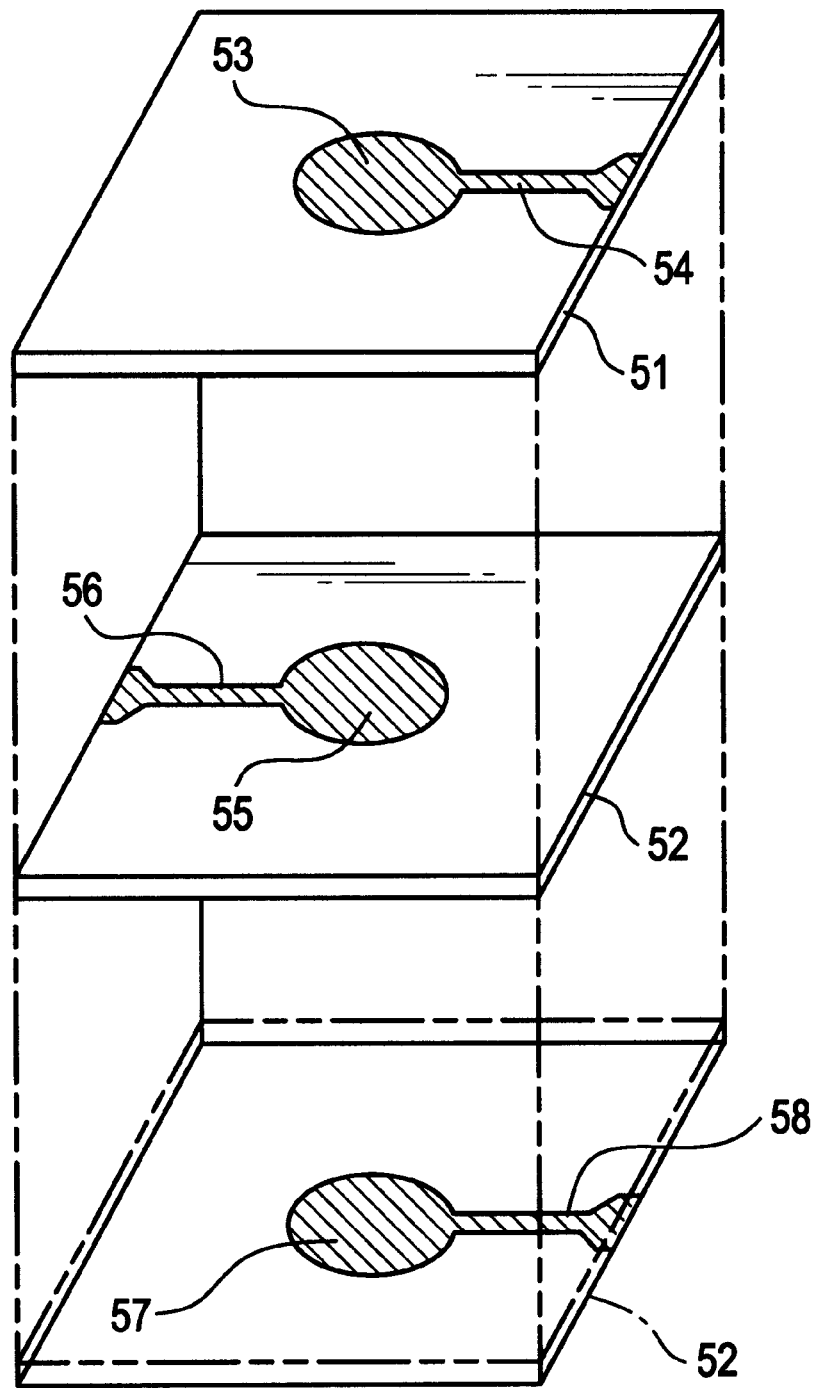
FIG. 21 is an exploded perspective view illustrating one example of the prior art thickness extensional piezoelectric resonator.

FIG. 20 is a perspective view showing a further modified example of the thickness extensional piezoelectric resonator in accordance with preferred embodiments of the present invention.

A thickness extensional piezoelectric resonator in accordance with preferred embodiments of the present invention is characterized in that the resonator makes use of harmonics of a thickness extensional vibration mode and that the ratio W/d is set within any one of the five certain ranges described above. Thus, unwanted spurious vibrations due to cross-sectional edge modes and other harmonics are suppressed. That is, the invention is not limited to an energy-trap piezoelectric resonator. As shown in FIG. 20, the invention can also be applied to a thickness extensional piezoelectric resonator other than the energy-trap type.

Referring to FIG. 20, a thickness extensional piezoelectric resonator 45 includes an elongated, substantially rectangular piezoelectric strip 46. The ratio W/d of the piezoelectric strip 46 is preferably set within any one of the five certain ranges described in connection with the first preferred embodiment. A first excitation electrode 47 and a second excitation electrode 48 are disposed along the whole top surface and over the whole bottom surface, respectively, of the piezoelectric strip 46. An internal electrode 50 is disposed inside the piezoelectric strip. In this piezoelectric strip 46, adjacent piezoelectric layers 46a and 46b are polarized oppositely in the direction of thickness.

Also, in the piezoelectric resonator 45, the ratio W/d is set within the certain ranges described above. Unwanted spurious vibrations caused by cross-sectional edge modes and other harmonics can be effectively suppressed, in the same way as in the thickness extensional piezoelectric resonator 11 according to the second preferred embodiment. As a result, excellent resonant characteristics are obtained.

While the invention has been particularly shown and described with reference to preferred embodiments thereof, it will be understood by those skilled man in the art that the forgoing and other changes in form and details may be made therein without departing from the spirit of the invention.

What is claimed is:

1. A thickness extensional vibration mode piezoelectric resonator utilizing an nth-order harmonic of a thickness extensional vibrational mode, said piezoelectric resonator comprising:

a piezoelectric plate having first and second surfaces arranged opposite to each other;

a first excitation electrode disposed on said first surface of said piezoelectric plate;

a second excitation electrode disposed on said second surface, the first and second excitation electrodes being opposed to each other with said piezoelectric plate located therebetween;

at least one internal electrode disposed in said piezoelectric plate and located at least partially opposite to the first and second excitation electrodes, an opposing portion of said first and second excitation electrodes, said internal electrode and said piezoelectric plate defining a resonating portion; wherein a ratio W/d is less than about 6.1 in which d=t/n, where W is a width of said piezoelectric plate and t is a thickness of said piezoelectric plate and n is an integral larger than 1, and wherein said piezoelectric plate has an elongated strip shape.

2. The thickness extensional vibration mode piezoelectric resonator according to claim 1, wherein said ratio W/d satisfies any one of the following ranges:

$W/d \leq 0.8$, $1.0 \leq W/d \leq 2.0$, $2.2 \leq W/d \leq 4.0$, $4.3 \leq W/d \leq 4.8$, $5.7 \leq W/d \leq 6.1$.

3. The thickness extensional vibration mode piezoelectric resonator according to claim 2, wherein said thickness extensional vibration mode piezoelectric resonator is an energy-trap piezoelectric resonator having said resonating portion and vibration-attenuating portions along only one direction, and said first and second excitation electrodes are provided so as to extend to or close to an end of said piezoelectric plate in a direction that is substantially perpendicular to said one direction along which said vibration-attenuating portions extend.

4. The thickness extensional vibration mode piezoelectric resonator of claim 2, further comprising a capacitor disposed on said first or second surfaces of said piezoelectric plate with a space therebetween for allowing free and unimpeded vibrations of the piezoelectric resonator.

5. The thickness extensional vibration mode piezoelectric resonator according to claim 1, wherein said thickness extensional vibration mode piezoelectric resonator is an energy-trap piezoelectric resonator having said resonating portion and vibration-attenuating por ions extending along only one direction, and said first and second excitation electrodes are arranged so as to extend to or close to an end of said piezoelectric plate in a direction that is substantially perpendicular to said one direction along which said vibration-attenuating portions extend.

6. The thickness extensional vibration mode piezoelectric resonator of claim 1, wherein said piezoelectric plate has a substantially rectangular shape.

7. The thickness extensional vibration mode piezoelectric resonator of claim 1, further comprising a plurality of vibration-attenuating portions in said piezoelectric plate and disposed on both sides of said resonating portion along only one direction.

8. The thickness extensional vibration mode piezoelectric resonator of claim 7, wherein said first and second excitation electrodes extend substantially to a respective one of both ends of the piezoelectric plate in a direction that is substantially perpendicular to said one direction.

9. The thickness extensional vibration mode piezoelectric resonator of claim 1, further comprising a capacitor disposed on said first or second surfaces of said piezoelectric plate with a space therebetween for allowing free and unimpeded vibrations of the piezoelectric resonator.

10. The thickness extensional vibration mode piezoelectric resonator of claim 1, wherein said nth-order harmonic of said thickness extensional vibration mode used in said resonator is a second order wave of said thickness extensional vibration mode.

11. The thickness extensional vibration mode piezoelectric resonator of claim 1, wherein said nth-order harmonic of said thickness extensional vibration mode used in said resonator is a third order wave of said thickness extensional vibration mode.

12. The thickness extensional vibration mode piezoelectric resonator of claim 1, wherein said nth-order harmonic of said thickness extensional vibration mode used in said resonator is a fourth order wave of said thickness extensional vibration mode.

13. The thickness extensional vibration mode piezoelectric resonator of claim 1, wherein said piezoelectric strip is polarized uniformly in a direction of thickness thereof.

14. The thickness extensional vibration mode piezoelectric resonator of claim 1, wherein said piezoelectric strip includes a plurality of piezoelectric layers each having a reverse electric field compared to an electric field of an adjacent one of the piezoelectric layers.

15. The thickness extensional vibration mode piezoelectric resonator of claim 1, wherein said piezoelectric strip includes portions which are alternately polarized oppositely in a direction of thickness thereof.

16. A piezoelectric resonator comprising:
- a piezoelectric plate having first and second surfaces arranged opposite to each other and being constructed to vibrate in a thickness extensional vibration mode piezoelectric resonator;
- a first excitation electrode disposed on said first surface of said piezoelectric plate;
- a second excitation electrode disposed on said second surface, the first and second excitation electrodes being opposed to each other with said piezoelectric plate located therebetween;
    - at least one internal electrode disposed in said piezoelectric plate and located at least partially opposite to the first and second excitation electrodes, an opposing portion of said first and second excitation electrodes, said internal electrode and said piezoelectric plate defining a resonating portion;
- a plurality of vibration-attenuating portions in said piezoelectric plate and disposed on both sides of said resonating portion along only one direction; wherein
- a ratio $W/d$ is less than about 6.1 in which $d=t/n$, where W is a width of said piezoelectric plate and t is a thickness of said piezoelectric plate and n is an integral larger than 1.

17. The piezoelectric resonator according to claim 16, wherein said ratio $W/d$ satisfies any one of the following ranges:

$W/d \leq 0.8$, $1.0 \leq W/d \leq 2.0$, $2.2 \leq W/d \leq 4.0$, $4.3 \leq W/d \leq 4.8$, $5.7 \leq W/d \leq 6.1$.

18. The piezoelectric resonator according to claim 16, wherein said thickness extensional vibration mode piezoelectric resonator is an energy-trap piezoelectric resonator having said resonating portion and vibration-attenuating portions extending along only one direction, and said first and second excitation electrodes are arranged so as to extend to or close to an end of said piezoelectric plate in a direction that is substantially perpendicular to said one direction along which said vibration-attenuating portions extend.

19. The piezoelectric resonator of claim 16, wherein said first and second excitation electrodes extend substantially to a respective one of both ends of the piezoelectric plate in a direction that is substantially perpendicular to said one direction.

* * * * *